US006937511B2

(12) United States Patent
Hsu et al.

(10) Patent No.: US 6,937,511 B2
(45) Date of Patent: Aug. 30, 2005

(54) CIRCUIT AND METHOD FOR PROGRAMMING CHARGE STORAGE MEMORY CELLS

(75) Inventors: Tzu-Hsuan Hsu, Jhongpu (TW); Chao-I Wu, Tainan (TW)

(73) Assignee: Macronix International Co., Ltd., Hsinchu (TW)

( * ) Notice: Subject to any disclaimer, the term of this patent is extended or adjusted under 35 U.S.C. 154(b) by 1 day.

(21) Appl. No.: 10/765,292

(22) Filed: Jan. 27, 2004

(65) Prior Publication Data

US 2005/0162922 A1 Jul. 28, 2005

(51) Int. Cl.[7] .............................................. G11C 11/34
(52) U.S. Cl. ............................... 365/185.03; 365/185.2
(58) Field of Search ........................ 365/185.03, 185.2

(56) References Cited

U.S. PATENT DOCUMENTS

| 5,483,486 | A | * | 1/1996 | Javanifard et al. ..... | 365/185.17 |
|---|---|---|---|---|---|
| 5,485,422 | A | * | 1/1996 | Bauer et al. ............ | 365/185.21 |
| 5,566,120 | A | * | 10/1996 | D'Souza ..................... | 365/227 |
| 5,602,775 | A | * | 2/1997 | Vo ......................... | 365/185.01 |
| 5,694,356 | A | * | 12/1997 | Wong et al. ........... | 365/185.03 |
| 5,768,192 | A | | 6/1998 | Eitan | |
| 5,966,603 | A | | 10/1999 | Eitan | |
| 6,011,725 | A | | 1/2000 | Eitan | |
| 6,074,917 | A | | 6/2000 | Chang et al. | |
| 6,219,276 | B1 | | 4/2001 | Parker | |
| 6,297,096 | B1 | | 10/2001 | Boaz | |
| 6,320,786 | B1 | | 11/2001 | Chang et al. | |
| 6,396,741 | B1 | | 5/2002 | Bloom et al. | |
| 6,487,114 | B2 | | 11/2002 | Jong et al. | |

OTHER PUBLICATIONS

Lusky, Eli, et al., "Spatial Characterization of Channel hot electron injection Utilizing subthreshold slope of the localized charge storage NROM memory device," Non-Volatile Semiconductor Memory.Workshop, Monterey, CA (Aug. 2001), 2 pages.
Lusky, Eli, et al., "Electron Discharge Model of Locally-Trapped Charge in Oxide-Nitride-Oxide (ONO) Gates for NROM Non-Volatile Semiconductor Memory Device," SSDM, Tokyo, Japan (Sep. 2001), 2 pages.
Boaz, Eitan, et al, "Can NROM, a 2-bit, Trapping Storage NVM Cell, Give a Real Challenge to Floating Gate Cells?" SSDM, Tokyo, Japan (1999).

* cited by examiner

Primary Examiner—M. Tran
(74) Attorney, Agent, or Firm—Haynes Beffel & Wolfeld LLP

(57) ABSTRACT

A circuit and method for self-converging programming of a charge storage memory cell, such as NROM or floating gate flash, having a source and a drain in a substrate, a charge storage element and a control gate. The method includes applying source voltage, inducing a body effect that increases the effective threshold, and increasing the source voltage along with the drain voltage to moderate hot electron injection efficiency during the program operation, at least during a portion of the program operation in which convergence on a target threshold occurs. A selected gate voltage is applied during the operation to establish the target threshold voltage. In multiple bit cells, the gate voltage is set according to the data values to be stored, enabling self-convergence at more than one target threshold.

49 Claims, 10 Drawing Sheets

CIRCUIT AND METHOD FOR PROGRAMMING CHARGE STORAGE MEMORY CELLS

BACKGROUND OF THE INVENTION

1. Field of the Invention

The present invention relates to non-volatile memory based on charge storage elements, such as NROM and floating gate flash memory, and to self-converging methods for programming single bit and multiple bit memory cells with target threshold voltages.

2. Description of Related Art

Non-volatile memories based on charge storage elements, including silicon-oxide-nitride-oxide-silicon SONOS-type cells and floating gate flash memory cells, are programmed by injecting charge into the charge storage element. The charge in the charge storage element affects the threshold voltage of the memory cell, and can be used for storing data.

One basic technique used in many prior art devices to inject charge into the charge storage element is known as hot electron injection. Hot electron injection involves applying a high-voltage to a control gate on the memory cell, a high-voltage to the drain, and ground or a low-voltage to the source. This biasing arrangement causes current to flow in the channel, and hot electrons are injected from the channel into the charge storage element because of the electric field established by the high control gate voltage. A SONOS-type cell that is programmed using hot electron injection is referred to as an NROM cell herein.

There are many variations on biasing schemes used for hot electron injection. One basic problem being addressed by these variations arises because the memory cells in a large array do not all behave uniformly during a programming operation. Therefore, for a given program pulse, there is a wide distribution in the amount of charge injected into the charge storage elements of memory cells in the array on a single device. The wide distribution of charge after a program pulse makes it difficult to predict the threshold voltage of the memory cell. Accordingly, algorithms have risen which attempt to account for the distribution in charge, and typically involve applying a program pulse and then executing a verify operation to test the threshold of the memory cell after the pulse. If the threshold has not reached the target threshold after the first pulse, then the programming is retried, followed by another verify operation, and so on. A discussion of this issue is provided in Bloom et al., U.S. Pat. No. 6,396,741, entitled PROGRAMMING OF NONVOLATILE MEMORY CELLS, issued May 28, 2002. See also, Chang et al., U.S. Pat. No. 6,320,786, entitled METHOD OF CONTROLLING MULTI-STATE NROM, issued Nov. 20, 2001; and Parker, U.S. Pat. No. 6,219,276, entitled MULTILEVEL CELL PROGRAMMING, issued Apr. 17, 2001.

Some conventional program methods are based on algorithms which apply constant drain voltage, on algorithms which step the drain voltage during the program operation, and on algorithms which step the gate voltage during the program operation. These algorithms as applied to NROM however do not lead to convergence of the threshold voltage after many pulses, and require a verify operation to determine the end of the operation. The verify operation is time-consuming, and requires complex program algorithms and supporting circuitry. In floating gate flash memory, while some program algorithms may self-converge, the programming speed and accuracy can be improved.

It is desirable therefore to provide a programming algorithm for charge storage memory cells which is self-converging, eliminating or reducing the need for verify operations, and reducing the time required for the program operation. Furthermore, it is desirable to provide a programming algorithm which is self-converging at more than one target threshold level to allow multiple bit storage in a single memory cell.

SUMMARY OF THE INVENTION

The present invention provides a method for self-converging programming of a charge storage memory cell having a source and a drain in a substrate, a charge storage element and a control gate. The method includes applying source voltage, inducing a body effect that increases the effective threshold, and increasing the source voltage along with the drain voltage to moderate hot electron injection efficiency during the program operation, at least during a portion of the program operation in which convergence on a target threshold occurs. A selected gate voltage is applied during the operation to establish the target threshold voltage. In multiple bit cells, the gate voltage is set according to the data values to be stored, enabling self-convergence at more than one target threshold. The embodiments of the method and system of the present invention are characterized herein as self-converging, when no verify operations are used to determine an end point of the operation. The method and system are self-converging for both single bit and multiple bit memory cell embodiments.

Embodiments of the method include holding the gate voltage substantially constant during the program operation, while holding the drain-to-source voltage substantially constant by increasing the source voltage and the drain voltage in equal steps, or at the same rate of increase.

Some embodiments of the invention include applying a sequence of source voltage pulses to the source, and increasing the source voltage comprises increasing the source voltage pulse heights in successive pulses in the sequence. Likewise, increasing the drain voltage includes applying a sequence of drain voltage pulses to the drain of the memory cell during the program operation, in which the drain voltage pulse heights are increased for successive pulses. In some embodiments, the pulses are synchronously increased by equal steps in the source and drain voltages. Verify pulses can be applied between program pulses, if desired. Other embodiments apply a source voltage and a drain voltage, which are ramped during the operation, without pulsing and consequential intervals between pulses.

In yet other embodiments of the invention, the method provides for programming a multilevel charge storage memory cell. The method includes determining a data value from one of more than two data values to be stored in the memory cell, and applying a gate voltage to the control gate at one of a predetermined set of gate voltage levels selected in response to the determined data value. In this manner, the threshold voltage converges on a target threshold corresponding with the determined data value for the memory cell. In charge trapping memory cell technologies, like SONOS-type cells, multilevel data can be stored in each side of the cell, in embodiments of the present invention.

The present invention is also embodied by an integrated circuit memory that comprises a memory array including decoding circuitry to select memory cells for programming. The integrated circuit includes a voltage supply circuit coupled to the memory array and adapted to apply a gate voltage, a source voltage and a drain voltage to the control gate, source and drain respectively of memory cells in the array. A program controller is coupled to the decoding circuit and to the voltage supply circuit. The program controller is adapted to execute a program operation as described above.

The invention is applicable to charge storage memory cells programmed by hot electron injection, including NROM cells in which charge is trapped in a charge trapping layer formed of silicon nitride, or other material, and floating gate flash memory cells in which charge is trapped in a conductive floating gate formed of polysilicon in typical implementations.

Implementations of the present invention increase the drain and source voltages during programming with substantially constant drain-to-source voltage. Increasing source voltage while reducing gate-to-source voltage, moderates the efficiency of the hot electron injection during programming and causes a self-convergence phenomenon. For example, by establishing a constant gate voltage, and applying increasing drain and source voltages to the memory cell during a portion of the programming operation in which the threshold voltage is achieved, a self-convergence on the target threshold voltage in the memory cells subject of the operation occurs, eliminating or reducing the need for verify operations. Implementations of the present invention require fewer program pulses and shorter programming times than prior art approaches. Also, over-programming is avoided because of the self-convergence of the threshold. The level of the self-converged threshold voltage can be well-controlled according to implementations of the present invention, allowing for realizations of multiple memory states in charge storage memory cells. According to embodiments of the invention, the target threshold can be selected by setting the gate voltage to a level corresponding with the data values to be stored, while applying the stepped or ramped source and drain voltages.

Other aspects and advantages of the present invention can be seen on review of the drawings, the detailed description and the claims, which follow.

DETAILED DESCRIPTION

A detailed description of embodiments of the present invention is provided with reference to FIGS. 1–11.

Figure 1:
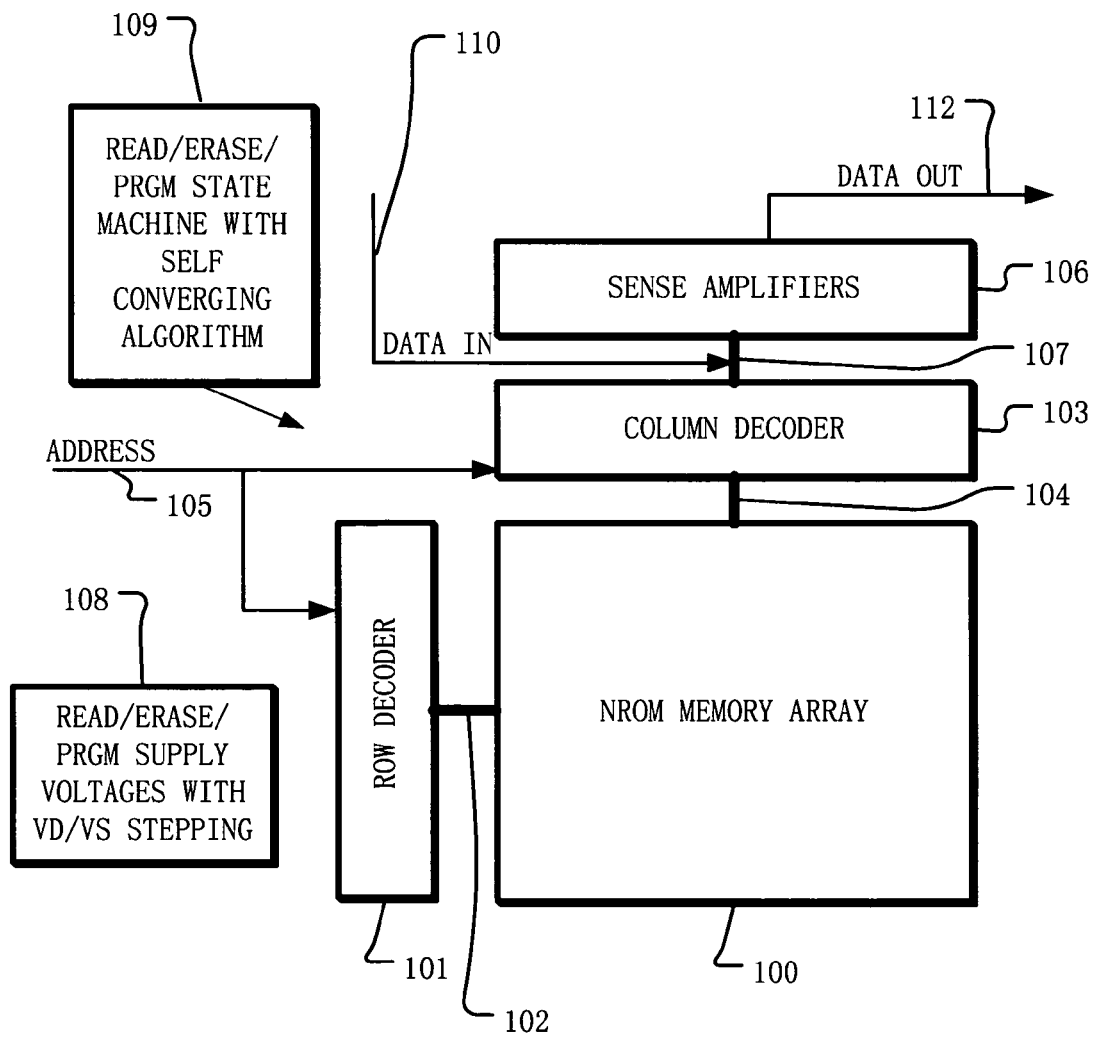
FIG. 1 is a simplified diagram of an integrated circuit memory device based on NROM memory cells with a self-convergence programming algorithm according to the present invention.

FIG. 1 is a simplified block diagram of an integrated circuit having sense amplifiers with latch timing control according to the present invention. The integrated circuit includes a memory array 100 implemented using NROM memory cells. Other embodiments use memory cells with charge storage elements other than a silicon nitride charge trapping layer, as used in an NROM cell, such as conductive floating gates as used in typical flash memory cells, and charge trapping layers comprising materials other than nitride. A row decoder 101, responsive to addresses on bus 105, is coupled to a plurality of word lines 102 arranged along rows in the memory array 100. A column decoder 103, responsive to addresses on line 105, is coupled to a plurality of bit lines 104 arranged along columns in the memory array 100. Addresses are supplied on bus 105 to column decoder 103 and row decoder 101. Sense amplifiers are provided in block 106, and coupled to the column decoder 103 via data bus 107. Data is supplied via the data-in line 110 from input/output ports on the integrated circuit to the data-in structures (not shown). Data is supplied via the data out line 112 from the sense amplifiers in block 106 to input/output ports on the integrated circuit.

In some embodiments, resources for controlling the reading, programming and erasing of memory cells in the array 100 are included on the chip. According to embodiments of the present invention, a self-converging program operation is implemented. These resources include read/erase/program supply voltage sources represented by block 108, and the state machine 109, which are coupled to the array 100, the decoders 101, 103 and other circuitry on the integrated circuit, which participate in operation of the device.

The supply voltage sources 108 are implemented in various embodiments using charge pumps, voltage regulators, voltage dividers and the like as known in the art, for supplying various voltage levels, including negative voltages, used in the read, erase and program operations.

The state machine 109 supports read, erase and program operations. The state machine 109 can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the state machine. The program operation of the present invention, which is self-converging in some embodiments, is described with reference to FIGS. 2-11.

Figure 2:
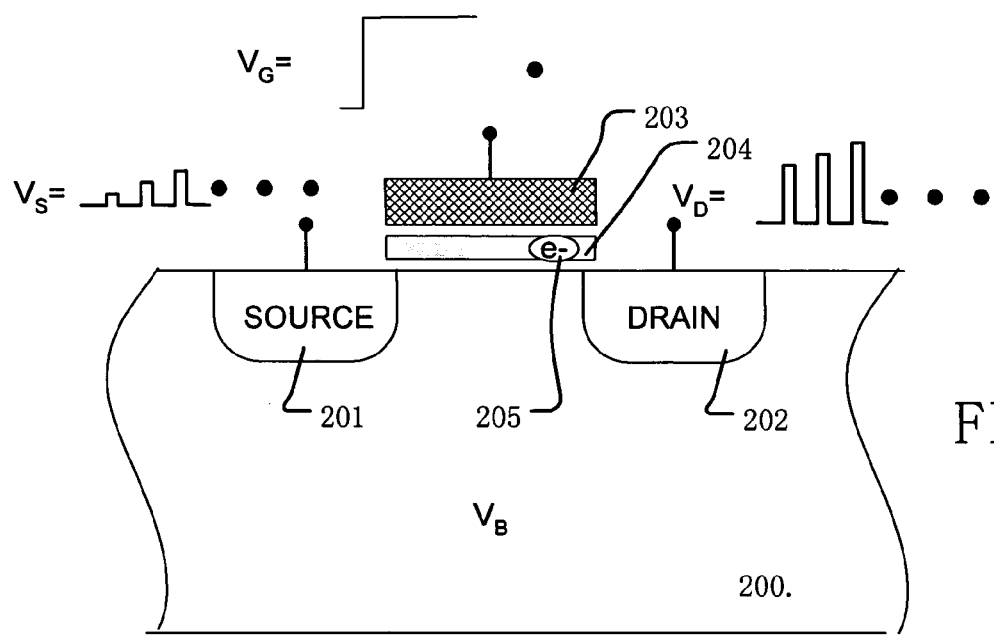
FIG. 2 is a simplified diagram of a NROM memory cell with data stored in one side of the charge-trapping layer, with program pulse voltages according to the present invention.

FIG. 2 is a simplified diagram of an NROM memory cell suitable for use in an integrated circuit as shown in FIG. 1. The memory cell is implemented in a semiconductor substrate 200. The cell includes a source 201 and a drain 202 formed by respective diffusion regions, separated by a channel in the substrate 200. A control gate 203 overlies the channel. A charge storage element 204 is isolated by an insulator such as silicon dioxide (not shown) between the control gate 203 and the channel. The charge storage element 204 comprises silicon nitride in an NROM cell. In other embodiments, other charge trapping material, such as $Al_2O_3$, $HfO_x$, $ZrO_x$, or other metal oxide can be used to form memory cells. Charge symbolized by charge trap 205 is trapped in the nitride layer, when the cell is biased for hot electron programming as illustrated.

In order to program the memory cell, control circuitry on the integrated circuit applies a source voltage $V_S$ to the source 201 (a sequence of pulses increasing incrementally in the example shown), a drain voltage $V_D$ to the drain 202 (a sequence of pulses increasing incrementally at about the same rate of increase as the source voltage pulses in the example shown), a gate voltage $V_G$ to the control gate 203 (a constant voltage in the example shown), and a substrate voltage $V_B$ to the substrate 200.

Figure 3:
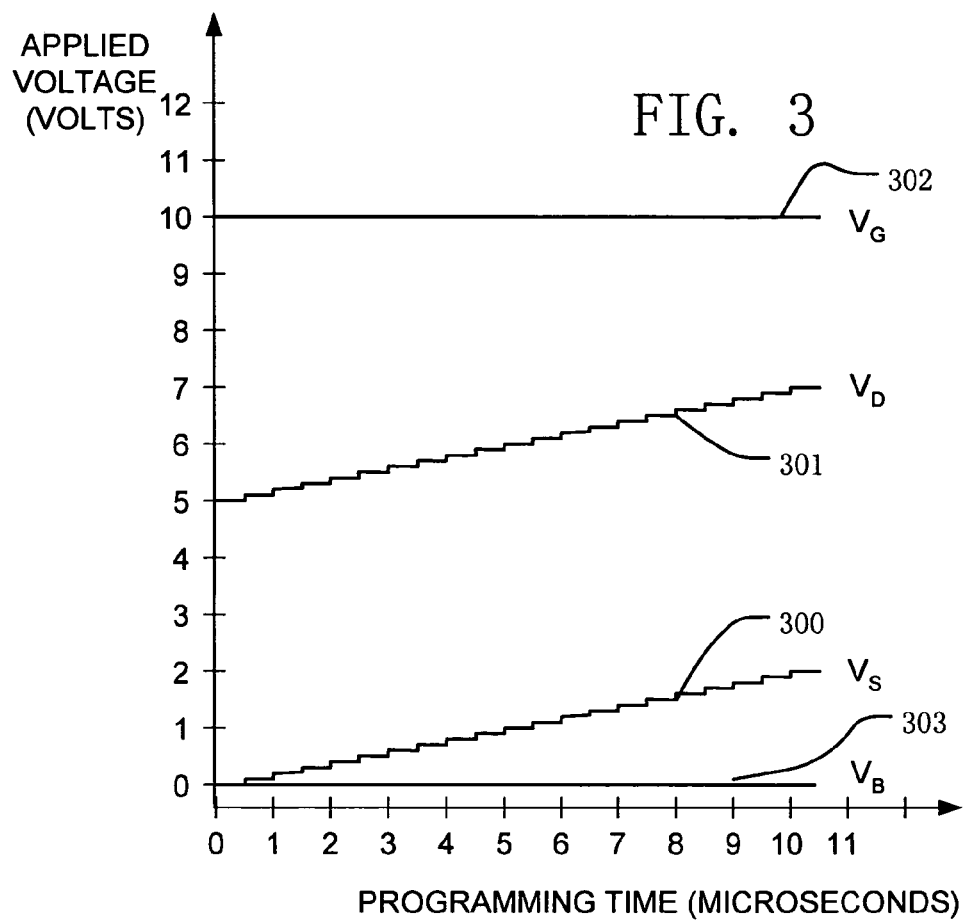
FIG. 3 illustrates voltages applied during a programming operation according to the present invention.

FIG. 3 illustrates the applied voltages for a programming operation for an NROM cell as shown in FIG. 2, according to one embodiment of the invention. The programming operation is designed to establish a target threshold voltage in the memory cell by injecting charge into the charge trapping layer 204. The programming operation includes applying a source voltage $V_S$ to the source of a selected memory cell as shown on trace 300, a drain voltage $V_D$ to the drain of a selected memory cell as shown on trace 301, a gate voltage $V_G$ to the control gate of a selected memory cell as shown on trace 302, and a substrate bias $V_B$ as shown on trace 303. As can be seen in FIG. 3, the programming operation includes increasing the source voltage $V_S$ from about 0 volts to about 2 volts, and increasing the drain voltage $V_D$ from about 5 volts to about 7 volts during the operation. The gate voltage $V_G$ is held substantially constant at a selected level at about 10 volts, which correlates with the target threshold voltage. The substrate bias $V_B$ is held constant at ground potential. In the example shown, the source voltage $V_S$ and the drain voltage $V_D$ are increased synchronously, and at the same rate of increase during the operation. In the particular example shown in FIG. 3, the source voltage $V_S$ is applied in a sequence of 0.5 microsecond pulses, with increasing amplitude of 0.1 volts per step. In the example shown, 20 steps are applied to achieve a 2 volts increase in source voltage $V_S$ over a program time of about 10 microseconds during the operation. Likewise, the drain voltage VD is applied in a sequence of 0.5 microsecond pulses, with increasing amplitude of 0.1 volts per step. In the embodiment described with reference to FIG. 3, the gate-to-source voltage $V_{GS}$ at the beginning of the program operation is about 10 volts. The gate-to-source voltage $V_{GS}$ is reduced during the program operation to about 8 volts at the end. Also, the drain-to-source voltage $V_{DS}$ is held substantially constant at about 5 volts during the program operation.

Figure 10:
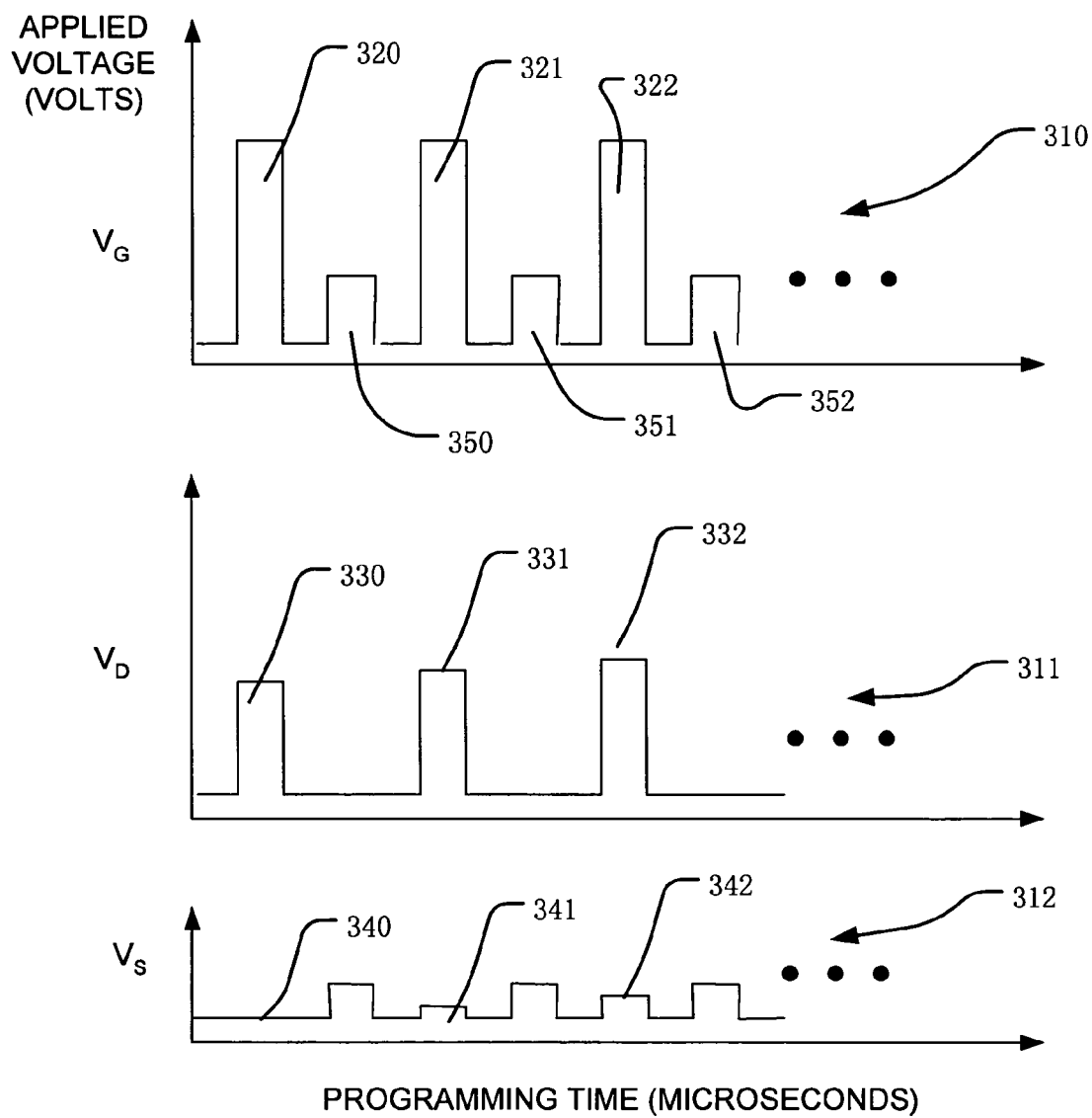
FIG. 10 illustrates voltages applied during a programming operation according to the present invention with program pulses, and with verify pulses between program pulses.

The pulses may be applied with intervals of zero voltage between the pulses. In other embodiments, verify pulses may be applied between program pulses, as shown in FIG. 10 below. Alternatively, the source and drain voltages may be ramped without intervals of zero voltage between pulses, with continuous or stepped increases in voltage.

In self-converging program algorithms according to the present invention in which no verify step is executed, the number of pulses (or amount of program time) is predetermined at a count that can be empirically determined to establish the target threshold voltage reliably across the memory array. As demonstrated by the experimental results described below, self-convergence can be achieved in a relatively small amount of time, so that less than 10 microseconds of program time (fewer than 20 pulses) may be needed in various embodiments of the invention.

In the embodiment described, the source voltage $V_S$ and a drain voltage $V_D$ are increased synchronously, and at the same rate of increase, while the gate voltage $V_G$ is held constant. In other embodiments, the relative rates of increase of the source voltage $V_S$ and the drain voltage $V_D$ can be modified according to needs of the particular implementation. Likewise, coordinated variations in the gate voltage may be applied, while maintaining the benefits of the present invention, by reducing the gate-to-source voltage $V_{GS}$ and the gate-to-drain voltage $V_{GD}$, while increasing the body effect during a program operation. Experimental results applying this technique, with a constant or nearly constant drain-to-source voltage $V_{DS}$ during a program operation establishes self-convergence of the threshold voltage of the memory cell and a threshold level that can be set by selecting the gate voltage $V_G$ to apply during the operation that correlates with the target threshold.

Figure 4:
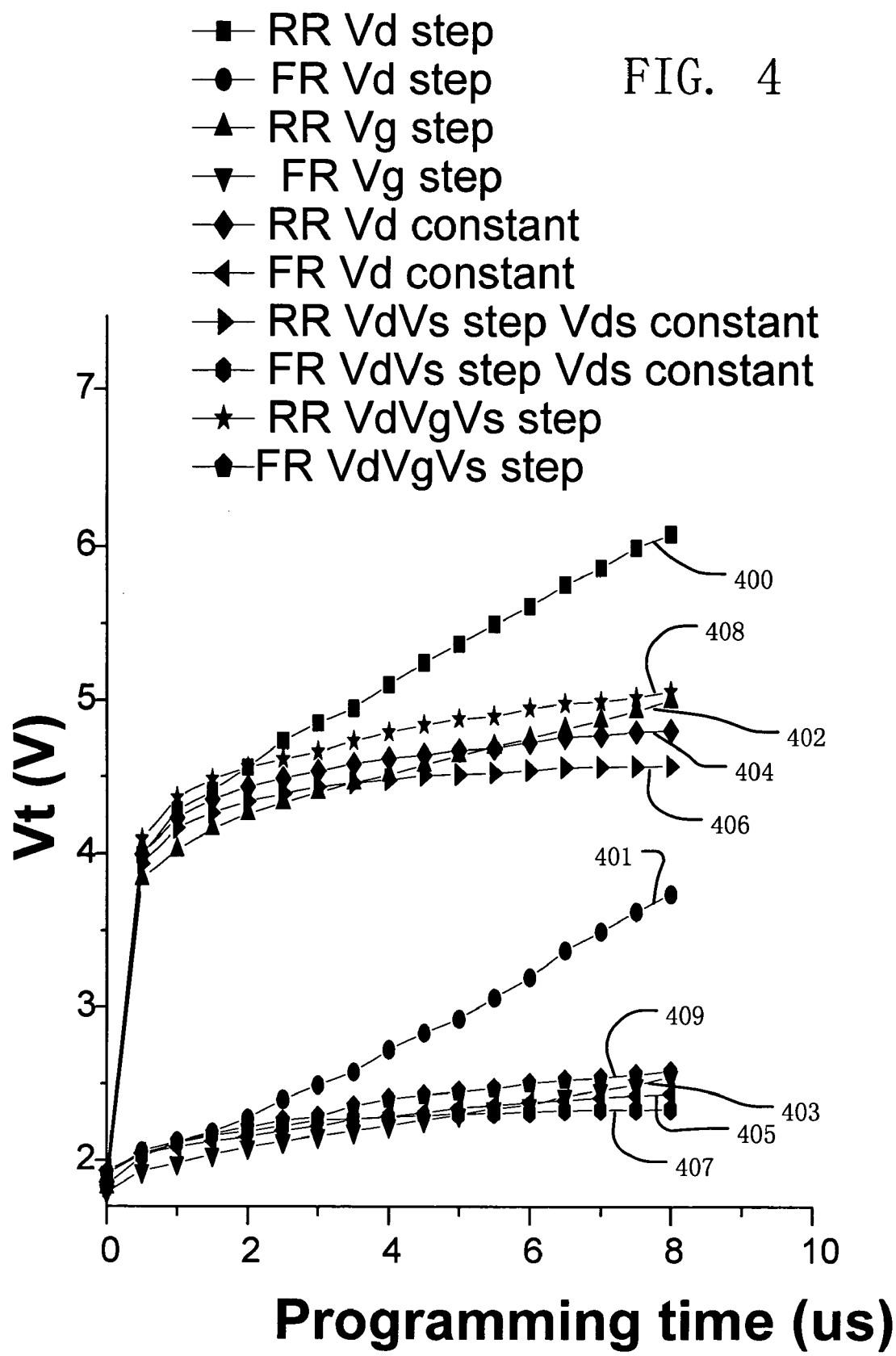
FIG. 4 is a graph of the threshold voltage versus programming time, showing comparative results for the present invention and prior art programming algorithms.

FIG. 4 illustrates the reverse read RR and forward read FR threshold voltages for an NROM cell according to five different program operations. In this experiment, the threshold voltage was defined based on a sense current of 10 microamps. However, the convergence is observed with other sense current levels. In this experiment, the threshold voltage was defined based on a sense current of 10 microamps. However, the convergence is observed with other sense current levels. The operations are referred to as (1) $V_D$ step, (2) $V_G$ step, (3) $V_D$ constant, (4) $V_D V_S$ step with $V_{DS}$ constant, and (5) $V_G V_D V_S$ step.

(1) $V_D$ step involved applying a gate voltage of 10 volts, the drain voltage of five volts with 0.1 volts stepping up to 7 volts, and the source at ground potential. The pulse width applied is 0.5 microseconds with a 1 microsecond interval between the pulses.

(2) $V_G$ step involved applying a gate voltage of 6 volts with 0.1 volts stepping up to 12 volts, the drain voltage of 5 volts held substantially constant with the source at ground potential. The pulse width was 0.5 microseconds with 1 microsecond intervals in between the pulses.

(3) $V_D$ constant involved applying 10 volts to the gate, 5 volts to the drain, and the source at ground potential in a sequence of 0.5 microseconds pulses with 1 microsecond intervals between the pulses.

(4) $V_D V_S$ step with $V_{DS}$ constant is like the program algorithm shown in FIG. 3, involving a gate voltage constant at 10 volts, a source voltage starting at zero volts with 0.1 volts stepping up to two volts, and a drain voltage of five volts with 0.1 volts stepping up to 7 volts, in a sequence of 0.5 microseconds pulses with 1 microsecond intervals between the pulses.

(5) $V_G V_D V_S$ step involved applying a gate voltage of 10 volts with 0.1 volts stepping up to 12 volts, a drain voltage of five volts with 0.1 volts stepping up to seven volts, and a source voltage of zero volts with 0.1 volts stepping up to two volts. Again, the pulse width and intervals for the pulses are 0.5 microseconds and 1 microsecond respectively.

FIG. 4 shows threshold voltage versus programming time for the various program algorithms explained above. The reverse read threshold for the $V_D$ step algorithm is shown in trace 400. The forward read threshold for the $V_D$ step algorithm is shown in trace 401. The reverse read threshold for the $V_G$ step algorithm is shown in trace 402, and the forward read threshold for the $V_G$ step algorithm is shown on trace 403. For the $V_D$ constant operation, the reverse read threshold is shown on trace 404, and the forward read threshold is shown on trace 405. For the $V_D V_S$ step $V_{DS}$ constant operation, the reverse read threshold is shown on trace 406, and the forward read threshold is shown on trace 407. Finally, for the $V_D V_G V_S$ step operation, the reverse read threshold is shown on trace 408, and the forward read threshold is shown on trace 409.

FIG. 4 illustrates that the threshold voltage for forward read and reverse read using the $V_D V_S$ step $V_{DS}$ constant operation of the present invention levels out at about five microseconds of programming time, while other approaches continue to increase in threshold voltage as subsequent pulses are applied.

Figure 5:
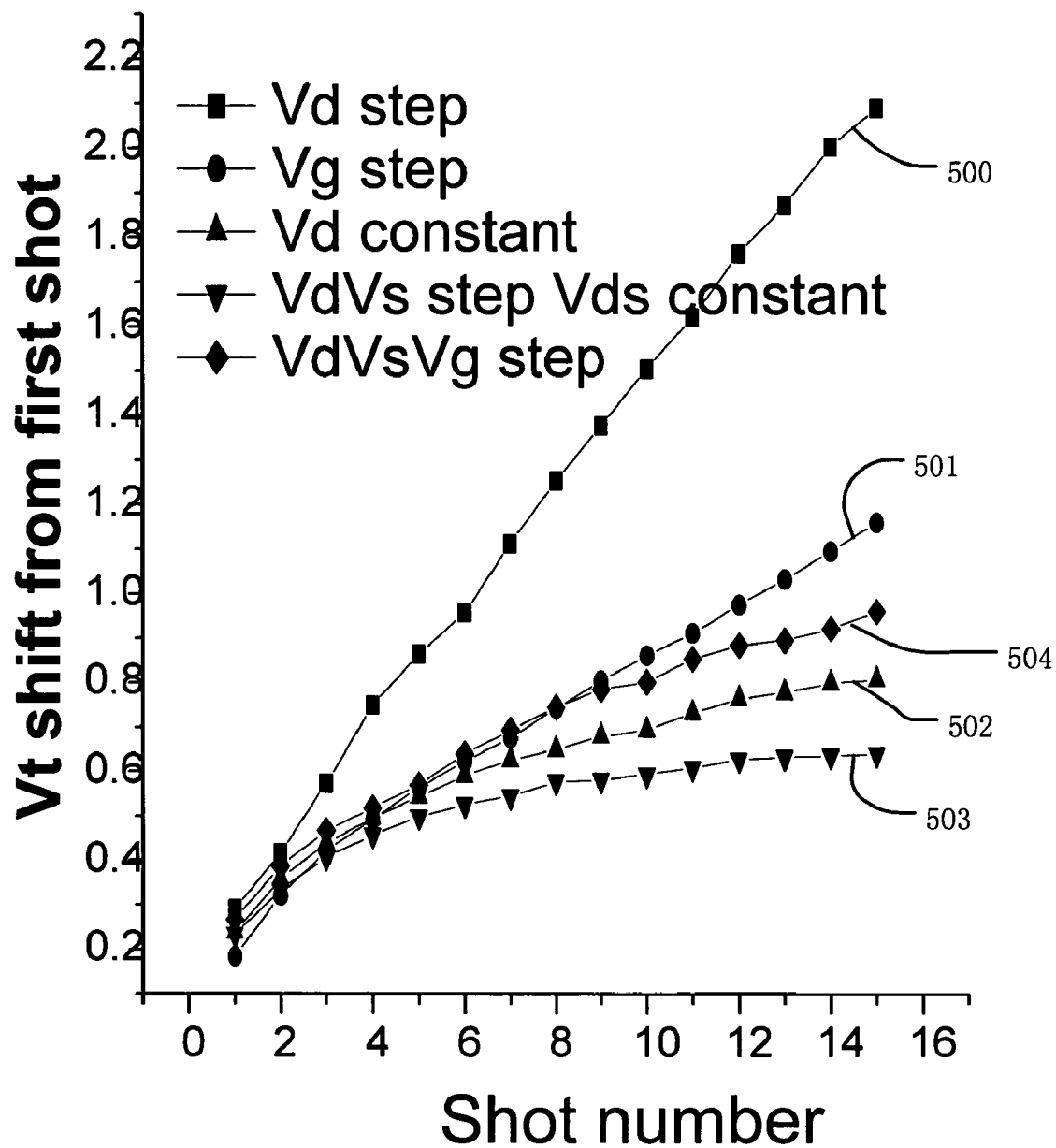
FIG. 5 is a graph of threshold voltage shift versus shot (pulse) number, showing comparative results for the present invention and prior art programming algorithms.

FIG. 5 expands the data by plotting a shift in threshold voltage for the forward read threshold, after the first shot for the five programming operations described above. The $V_D$ step operation is plotted on trace 500. The $V_G$ step operation is plotted on trace 501. The $V_D$ constant operation is plotted on trace 502. The $V_D V_S$ step $V_{DS}$ constant is plotted on trace 503. The $V_D V_S V_G$ step operation is plotted on trace 504. The plot in FIG. 5 shows that for shot numbers 8 through 15, less than 0.1 volt shift in threshold voltage is encountered applying the $V_D V_S$ step $V_{DS}$ constant of the present invention, while the other program operations suffer significantly greater shift in threshold voltage.

Figure 6:
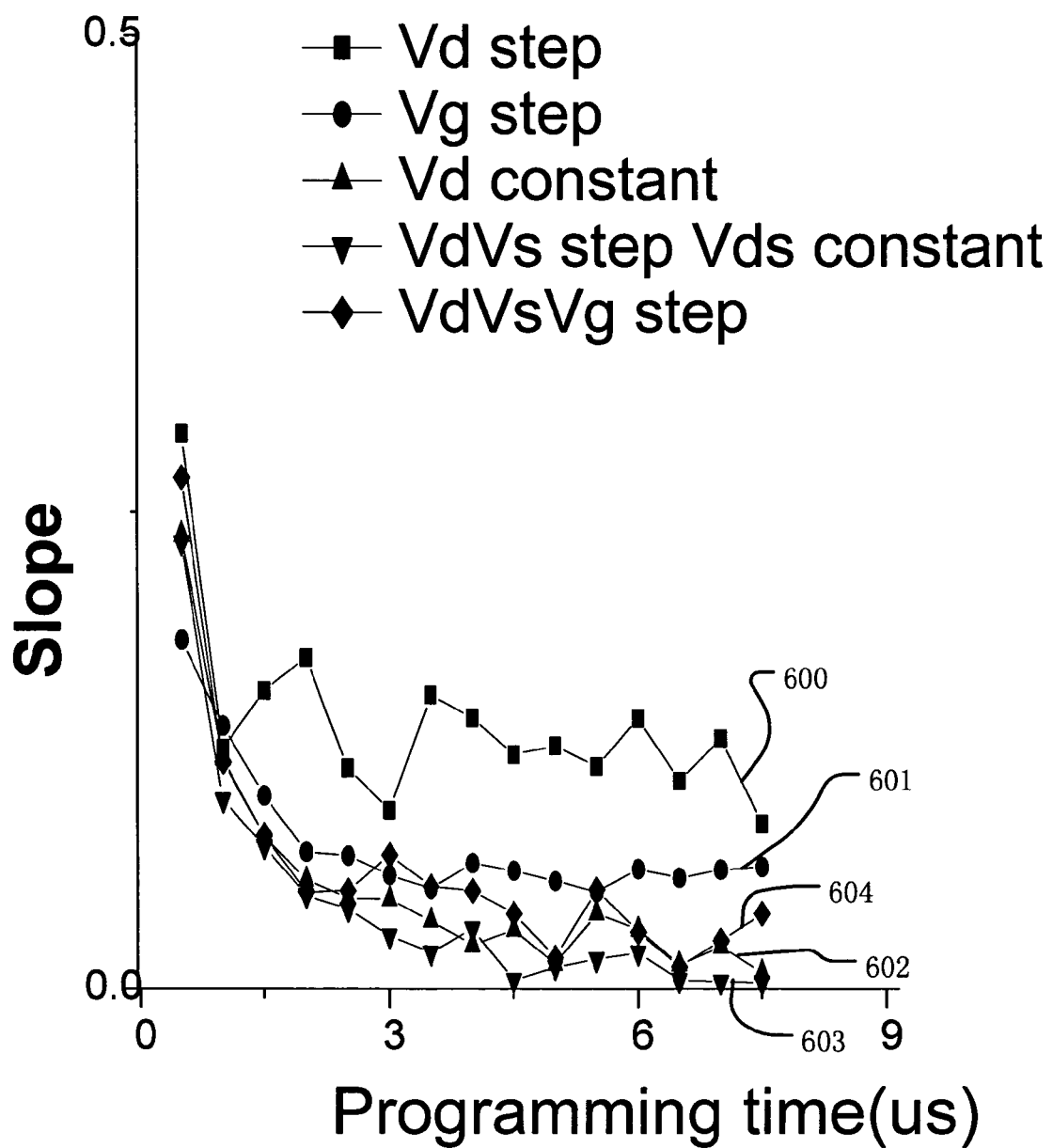
FIG. 6 is a graph of the slope of the threshold change versus programming time, showing comparative results for the present invention and prior art programming algorithms.

FIG. 6 illustrates this experimental data from the point of view of the slope of the graph showing change in threshold voltage. The $V_D$ step operation is plotted on trace 600. The $V_G$ step operation is plotted on trace 601. The $V_D$ constant operation is plotted on trace 602. The $V_D V_S$ step $V_{DS}$ constant operation is plotted on trace 603. The $V_D V_S V_G$ step operation is plotted on trace 604. Self-convergence is achieved with a zero or substantially zero slope, as shown on trace 603 applying the $V_D V_S$ step $V_{DS}$ constant operation described above.

Figure 7:
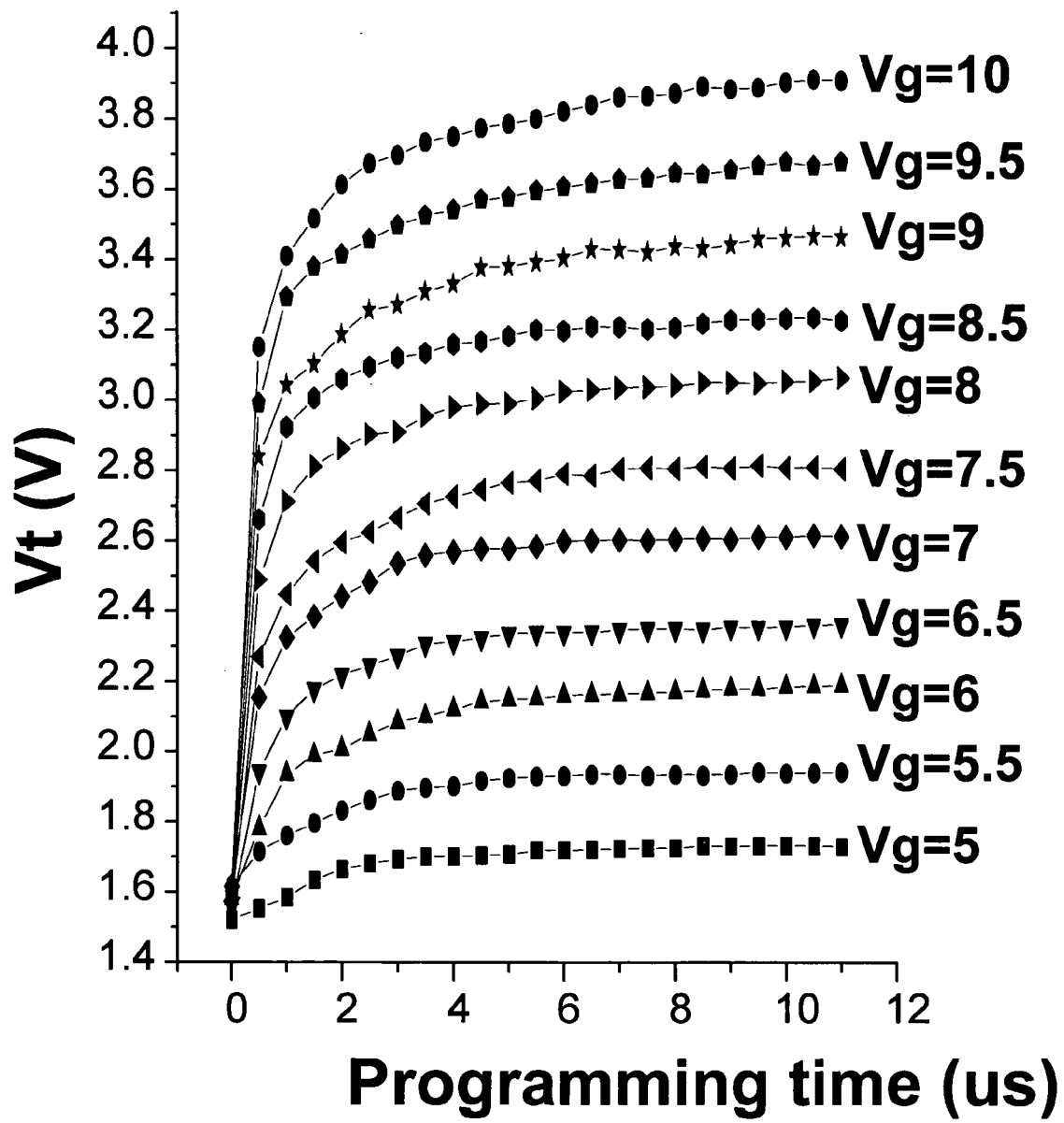
FIG. 7 is a graph showing threshold voltage versus programming time for a plurality of predetermined gate voltages, according to embodiments of the present invention.

FIG. 7 illustrates the capability of the present invention to achieve multilevel storage in a charge trapping device such as an NROM. Applying the $V_D V_S$ step $V_{DS}$ constant operation with a gate voltage $V_G$ selected according to a target threshold voltage allows achieving the number of different threshold voltages. The plot in FIG. 7 shows the shift in the reverse read threshold voltage for gate voltages ranging from 5 volts to 10 volts in 0.5 volt steps. In this experiment, the threshold was defined at a sense current of 1 microamp, so the thresholds are slightly lower than those in the experiment shown in FIG. 4. As illustrated by these experimental results, the target threshold voltage correlates well with a gate voltage, and achieves self convergence for many different target threshold voltages.

Figure 8:
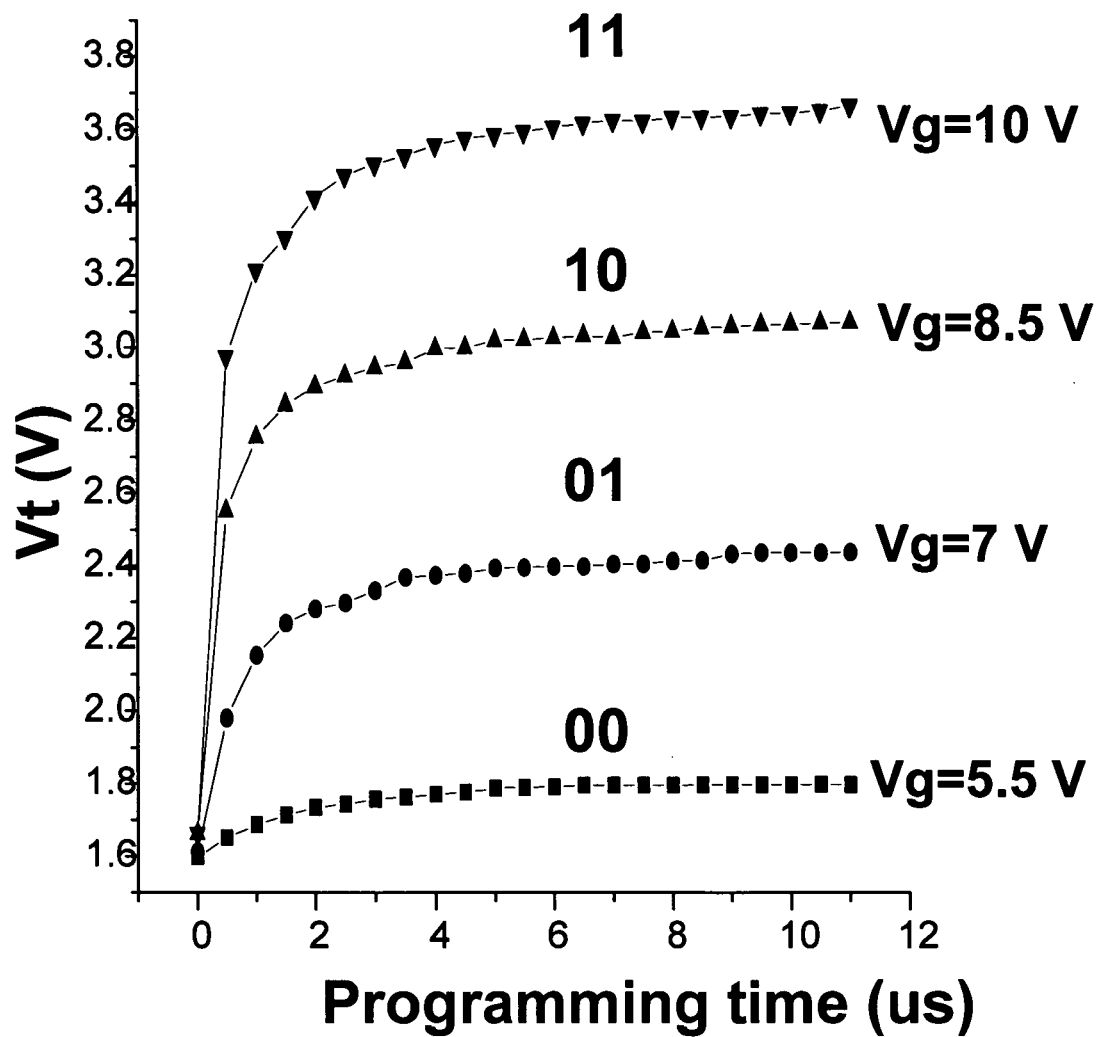
FIG. 8 is a graph showing threshold voltage versus programming time for four predetermined gate voltages, according to a two-bit memory cell according to the present invention.

FIG. 8 illustrates one approach to storing two bits per cell in an NROM cell, such as shown in FIG. 2. According to the embodiment in FIG. 8, four different data values (00, 01, 10, 11) representing two bits of data are stored in the memory cell with the target thresholds being set by the $V_D V_S$ step $V_{DS}$ constant operation with a gate voltage $V_G$ set at corresponding levels. Thus, the data value 11 is stored by applying a gate voltage of 10 volts. The data value 10 is stored by applying a gate voltage of 8.5 volts. The data value 01 is stored by applying a gate voltage of seven volts. The data value 00 is stored by applying a gate voltage of 5.5 volts during the programming operation.

Figure 9:
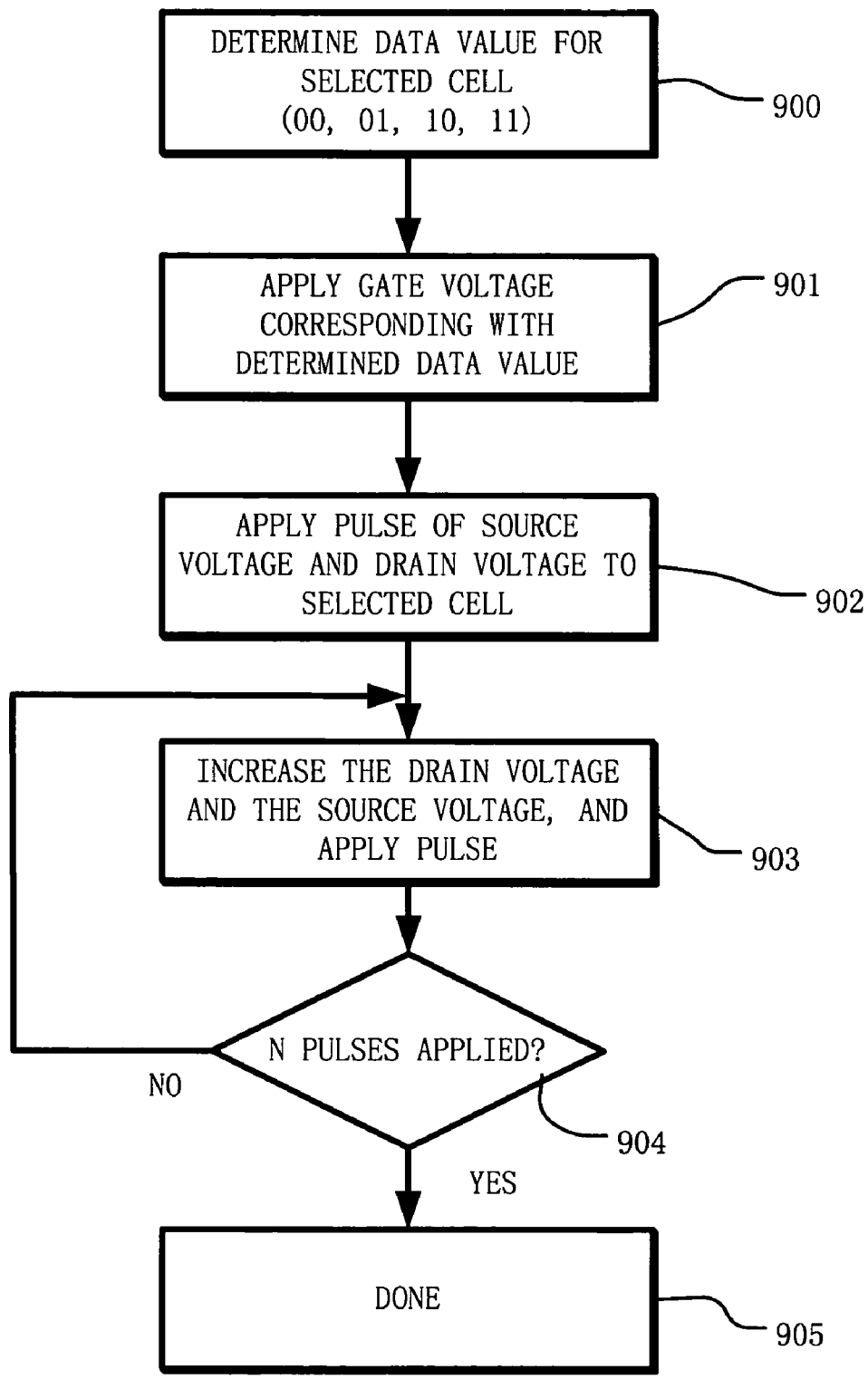
FIG. 9 is a simplified flowchart for a programming algorithm according to embodiments of the present invention.

A method for programming according to the present invention is summarized by the flowchart shown in FIG. 9. The method includes determining a data value for a selected memory cell. The data value can be a single bit or multiple bits according to a particular implementation. In the example shown in FIG. 9, the data value is selected from four different data values (00, 01, 10, 11) representing two bits of data (block 900). Next, a gate voltage corresponding with the determined data value is applied (block 901). Then, a pulse of source voltage and drain voltage is applied to the selected cell (block 902). Then the drain voltage and source voltage are increased and a next pulse is applied (block 903). In the next operation, the algorithm determines whether a predetermined number N of pulses has been applied (block 904). If the predetermined number N of pulses has not been applied, then the algorithm loops back to block 903 to apply a next pulse. If the predetermined number N of pulses has been applied, then the algorithm is done (block 905).

In the embodiment shown in FIG. 9, there is no program verify operation between the program pulses. Rather, a predetermined number of pulses is applied, and because of the self-converging nature of the program operation, the algorithm is finished after that number of pulses is applied without a verify step.

In alternative algorithms, verify steps may be applied if desired, while taking advantage of the unique program operation provided by the present invention to achieve faster and more accurate convergence. For example, one possible embodiment includes applying a first type of program bias during a first part of a program operation, and applying the $V_D V_S$ step $V_{DS}$ constant operation during a final portion of the program operation in which convergence on the threshold voltage is achieved.

FIG. 10 is a graph showing the gate voltage $V_G$ on trace 310, the drain voltage $V_D$ on trace 311 and a source voltage $V_S$ on trace 312 for a program algorithm including program pulses interleaved with verify pulses according to one example embodiment of the present invention. In this example, the gate voltage applied during the program algorithm comprises a plurality of program pulses 320, 321, 322 which have constant magnitude selected to set the threshold voltage of the cell being programmed. The program pulses 320, 321, 322 of gate voltage $V_G$ are aligned with program pulses 330, 331, 332 of drain voltage $V_D$, which increase from a first level in pulse 330, to a second level in pulse 331 that is an incremental value (for example about 0.1 volts) higher than the first level, to a third level in pulse 332 that is an incremental value (for example about 0.1 volts) higher again than the second level. The program pulses 340, 341 and 342 in the source voltage $V_S$ are shown on trace 312. The first source voltage program pulse 340 is aligned with the program pulses 320 and 330 on the gate and drain respectively, and has first level of for example ground potential. The second program pulse 341 on the source is aligned with the program pulses 321 and 331 on the gate and drain respectively, and has a second level that is an incremental value higher than the first level. The third program pulse 342 on the source voltage is aligned with the program pulses 322 and 332 on the gate and drain respectively, and has a third level that is an incremental value higher than the second level. The incremental increase between the pulses on the source are essentially the same as the incremental increases in voltage for the drain voltage pulses to maintain essentially constant drain-to-source voltage. Although the incremental increases are constant for each increase in source and drain voltage in this example, other embodiments of the invention will apply different incremental increases between program pulses for one or more of the program pulses in sequence. The voltage levels will be optimized according to the particular implementations and parameters of the design.

In the example shown in FIG. 10, verify pulses are interleaved with the program pulses. Thus, a verify pulse 350 on the gate is applied at about for example three volts, between the program pulses 320 and 321. Also, verify pulses 351, 352 are applied in sequence as shown in FIG. 10. The verify pulses on the drain voltage are set at ground potential in this example. The source voltage for program verify in this example is set at a constant pulse height of for example 1.6 volts. The verify pulses are designed to allow sensing whether the program has been successful after program pulses. If the threshold target is reached as indicated during a verify pulse, then the program algorithm can be stopped. The verify pulses might be applied between all program pulses; they might be applied only after a predetermined number of program pulses has been applied; or they might be applied in other patterns which meet the design goals for the particular system.

Figure 11:
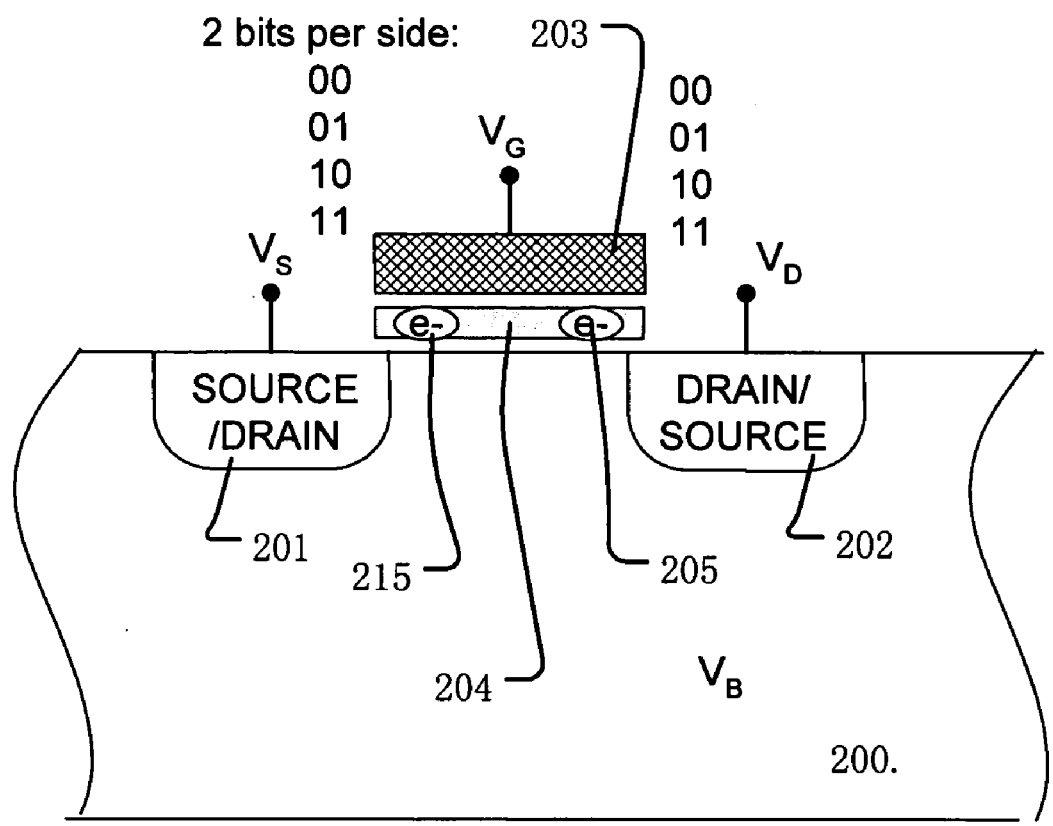
FIG. 11 is a simplified diagram of a NROM memory cell with multilevel data stored in two sides of the charge-trapping layer.

FIG. 11 illustrates another aspect of the present invention, in which multiple levels of threshold are applied to both sides of a charge trapping type memory cell. The memory cell in FIG. 11 is an NROM cell, and the same reference numerals as shown in FIG. 2 are used for like components. However, as can be seen, charge trapping is established on both sides of the cell in charge trapping layer 204, as symbolized by charge traps 205 and 215. The terminal 201 is labeled source/drain and the terminal 202 is labeled drain/source. Each terminal 201, 202 acts as either the source or drain depending on the side of the cell being programmed or sensed. In this example, two bits are represented by a four threshold levels on each side of the memory cell, establishing 4 bits of storage of per cell for a high density NROM memory. Other multiple bit configurations can be provided in other embodiments. Although the embodiment shown includes a single, continuous charge trapping layer across the channel in the memory cell, other embodiments may have charge trapping structures that are not continuous.

The present invention provides a high speed, self-converging algorithm for programming NROM and related non-volatile memory based on charge storage structures. The algorithm is applicable as well to floating gate flash memory cells.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for programming a charge storage memory cell having a source and a drain in a substrate, a charge storage element, and a control gate, comprising:
   applying a gate voltage to the control gate relative to a reference voltage, a source voltage to the source relative to the reference voltage, and a drain voltage to the drain relative to the reference voltage, in an operation to induce charge transfer to the charge storage element and establish a threshold voltage for the memory cell;
   increasing the drain voltage during the operation; and
   increasing the source voltage while increasing the drain voltage during the operation.

2. The method of claim 1, wherein the operation is self-converging during a portion of the program operation in which the voltage threshold converges on an ending threshold.

3. The method of claim 1, including holding the gate voltage substantially constant during a portion of the program operation in which the voltage threshold converges on an ending threshold.

4. The method of claim 1, including holding the gate voltage substantially constant during the program operation.

5. The method of claim 1, wherein the memory cell has a drain-to-source voltage between the source and the drain, including holding the gate voltage substantially constant during the program operation, and holding the drain-to-source voltage substantially constant during the program operation.

6. The method of claim 1, wherein the applying includes applying a sequence of source voltage pulses to the source, and said increasing the source voltage comprises increasing the source voltage pulse heights in successive pulses in the sequence, and applying a sequence of drain voltage pulses to the drain of the memory cell during the operation and said increasing the drain voltage comprises increasing the drain voltage pulse heights in successive pulses in the sequence.

7. The method of claim 1, wherein the applying includes applying a sequence of source voltage pulses to the source, and said increasing the source voltage comprises increasing the source voltage pulse heights in successive pulses in the sequence, and applying a sequence of drain voltage pulses to the drain of the memory cell during the operation and said increasing the drain voltage comprises increasing the drain voltage pulse heights in successive pulses in the sequence; and including
   applying verify pulses between successive pulses in the sequence.

8. The method of claim 1, wherein the applying includes applying a ramped source voltage to the source and a ramped drain voltage to the drain of the memory cell during the operation.

9. The method of claim 1, including holding the gate voltage substantially constant during the operation, and wherein said increasing the source and drain voltages comprises stepping the source and drain voltages by substantially equal steps during the operation.

10. The method of claim 1, including coupling the substrate to the reference voltage during the operation.

11. The method of claim 1, wherein said charge storage element in the memory cell comprises a non-conductive charge trap.

12. The method of claim 1, wherein said charge storage element in the memory cell comprises a conductive floating gate.

13. The method of claim 1, wherein said memory cell comprises an NROM cell.

14. The method of claim 1, wherein said memory cell comprises a flash memory cell.

15. The method of claim 1, wherein the memory cell is adapted to store a plurality of bits, and including setting the gate voltage to one of a predetermined set of gate voltages during the operation to establish one of a corresponding set of threshold voltages in the memory cell.

16. The method of claim 1, including applying another program operation to induce charge trapping on another side of the memory cell, including
   applying a gate voltage to the control gate of the selected memory cell relative to a reference voltage, a source voltage to the second terminal of the selected memory cell relative to the reference voltage, and a drain voltage to the first terminal of the selected memory cell, relative to the reference voltage;

increasing the drain voltage during the operation; and increasing the source voltage while increasing the drain voltage during the operation.

17. A method for programming a multi-level charge storage memory cell having a first terminal and a second terminal acting as sources and drains in a substrate, a charge storage element, and a control gate, comprising:

determining a data value from one of more than two data values to be stored in the memory cell;

applying a gate voltage to the control gate relative to a reference voltage, a source voltage to the first terminal relative to the reference voltage, and a drain voltage to the second terminal relative to the reference voltage, in a program operation to induce charge transfer to the charge storage element to establish a threshold voltage for the memory cell;

holding the gate voltage substantially constant at one of a predetermined set of gate voltages in response to the determined data value during a portion of the program operation in which the voltage threshold converges on a target threshold corresponding with the determined data value;

increasing the drain voltage during the operation; and increasing the source voltage while increasing the drain voltage during the operation.

18. The method of claim 17, wherein the operation is self-converging during a portion of the program operation in which the voltage threshold converges on an ending threshold.

19. The method of claim 17, wherein the memory cell has a drain-to-source voltage between the first and second terminals, including holding the drain-to-source voltage substantially constant during the program operation.

20. The method of claim 17, wherein the applying includes applying a sequence of source voltage pulses to the first terminal, and said increasing the source voltage comprises increasing the source voltage pulse heights in successive pulses in the sequence, and applying a sequence of drain voltage pulses to the second terminal of the memory cell during the operation and said increasing the drain voltage comprises increasing the drain voltage pulse heights in successive pulses in the sequence.

21. The method of claim 17, wherein the applying includes applying a sequence of source voltage pulses to the first terminal, and said increasing the source voltage comprises increasing the source voltage pulse heights in successive pulses in the sequence, and applying a sequence of drain voltage pulses to the second terminal of the memory cell during the operation and said increasing the drain voltage comprises increasing the drain voltage pulse heights in successive pulses in the sequence; and including applying verify pulses between successive pulses in the sequence.

22. The method of claim 17, wherein the applying includes applying a ramped source voltage to the first terminal and a ramped drain voltage to the second terminal of the memory cell during the operation.

23. The method of claim 17, wherein said increasing the source and drain voltages comprises stepping the source and drain voltages by equal steps during the operation.

24. The method of claim 17, including coupling the substrate to the reference voltage during the operation.

25. The method of claim 17, wherein said charge storage element in the memory cell comprises a non-conductive charge trap.

26. The method of claim 17, wherein said charge storage element in the memory cell comprises a conductive floating gate.

27. The method of claim 17, wherein said memory cell comprises an NROM cell.

28. The method of claim 17, wherein said memory cell comprises a flash memory cell.

29. The method of claim 17, including applying another program operation to induce charge trapping on another side of the memory cell, including applying a gate voltage to the control gate of the selected memory cell relative to a reference voltage, a source voltage to the second terminal of the selected memory cell relative to the reference voltage, and a drain voltage to the first terminal of the selected memory cell, relative to the reference voltage;

increasing the drain voltage during the operation; and increasing the source voltage while increasing the drain voltage during the operation.

30. An integrated circuit, comprising:

a memory array including decoding circuitry to select memory cells for programming, the memory cells having first and second terminals in a substrate acting as sources and drains, a charge storage element, and a control gate, wherein said charge storage element in the memory cell comprises a non-conductive charge trap;

a voltage supply circuit coupled to the memory array adapted to apply a gate voltage, a source voltage and a drain voltage to the control gate, first terminal and second terminal, respectively, of memory cells in the array; and a program controller coupled to the decoding circuitry and to the voltage supply circuit, the program controller adapted to execute a self-converging program operation for a selected memory cell to induce charge transfer to the charge storage element and establish a threshold voltage for the selected memory cell.

31. The integrated circuit of claim 30, wherein said memory cell comprises an NROM cell.

32. The integrated circuit of claim 30, wherein the memory cell is adapted to store a plurality of bits, and the program operation establishes one of a set of threshold voltages corresponding with the plurality of bits in the memory cell.

33. An integrated circuit, comprising:

a memory array including decoding circuitry to select memory cells for programming, the memory cells having first and second terminals in a substrate acting as sources and drains, a charge storage element, and a control gate;

a voltage supply circuit coupled to the memory array adapted to apply a gate voltage, a source voltage and a drain voltage to the control gate, first terminal and second terminal respectively, of memory cells in the array; and a program controller coupled to the decoding circuitry and to the voltage supply circuit, the program controller adapted to execute a program operation for a selected memory cell to induce charge transfer to the charge storage element and establish a threshold voltage for the selected memory cell, the program operation including applying a gate voltage to the control gate of the selected memory cell relative to a reference voltage, a source voltage to the first terminal of the selected memory cell relative to the reference voltage, and a drain voltage to the second terminal of the selected memory cell, relative to the reference voltage;

increasing the drain voltage during the operation; and increasing the source voltage while increasing the drain voltage during the operation.

34. The integrated circuit of claim 33, wherein the operation is self-converging during a portion of the program operation in which the voltage threshold converges on an ending threshold.

35. The integrated circuit of claim 33, including holding the gate voltage substantially constant during a portion of the program operation in which the voltage threshold converges on an ending threshold.

36. The integrated circuit of claim 33, including holding the gate voltage substantially constant during the program operation.

37. The integrated circuit of claim 33, wherein the memory cell has a drain-to-source voltage between the first and second terminals, including holding the gate voltage substantially constant during the program operation, and holding the drain-to-source voltage substantially constant during the program operation.

38. The integrated circuit of claim 33, wherein the applying includes applying a sequence of source voltage pulses to the first terminal, and said increasing the source voltage comprises increasing the source voltage pulse heights in successive pulses in the sequence, and applying a sequence of drain voltage pulses to the second terminal of the memory cell during the operation and said increasing the drain voltage comprises increasing the drain voltage pulse heights in successive pulses in the sequence.

39. The integrated circuit of claim 33, wherein the applying includes applying a sequence of source voltage pulses to the first terminal, and said increasing the source voltage comprises increasing the source voltage pulse heights in successive pulses in the sequence, and applying a sequence of drain voltage pulses to the second terminal of the memory cell during the operation and said increasing the drain voltage comprises increasing the drain voltage pulse heights in successive pulses in the sequence; and including applying verify pulses between successive pulses in the sequence.

40. The integrated circuit of claim 33, wherein the applying includes applying a ramped source voltage to the first terminal and a ramped drain voltage to the second terminal of the memory cell during the operation.

41. The integrated circuit of claim 33, including holding the gate voltage substantially constant during the operation, and wherein said increasing the source and drain voltages comprises stepping the source and drain voltages by substantially equal steps during the operation.

42. The integrated circuit of claim 33, wherein the substrate is coupled to the reference voltage during the operation.

43. The integrated circuit of claim 33, wherein said charge storage element in the memory cell comprises a non-conductive charge trap.

44. The integrated circuit of claim 33, wherein said charge storage element in the memory cell comprises a conductive floating gate.

45. The integrated circuit of claim 33, wherein said memory cell comprises an NROM cell.

46. The integrated circuit of claim 33, wherein said memory cell comprises a flash memory cell.

47. The integrated circuit of claim 33, wherein the memory cell is adapted to store a plurality of bits, and the program operation includes setting the gate voltage to one of a predetermined set of gate voltages during the operation to establish one of a corresponding set of threshold voltages in the memory cell.

48. The integrated circuit of claim 33, wherein the program controller is adapted to apply another program operation to induce charge trapping on another side of the memory cell, including applying a gate voltage to the control gate of the selected memory cell relative to a reference voltage, a source voltage to the second terminal of the selected memory cell relative to the reference voltage, and a drain voltage to the first terminal of the selected memory cell, relative to the reference voltage;

increasing the drain voltage during the operation; and increasing the source voltage while increasing the drain voltage during the operation.

49. An integrated circuit, comprising:

a memory array including decoding circuitry to select memory cells for programming, the memory cells having first and second terminals in a substrate acting as sources and drains, a charge storage element, and a control gate;

a voltage supply circuit coupled to the memory array adapted to apply a gate voltage, a source voltage and a drain voltage to the control gate, first terminal and second terminal respectively, of memory cells in the array; and a program controller coupled to the decoding circuitry and to the voltage supply circuit, the program controller adapted to execute a program operation for a selected memory cell to induce charge transfer to the charge storage element on first and second sides of the memory cell, and establish threshold voltages on the first and second sides of the selected memory cell, the program operation including storing more than one bit of information in each of the first and second sides of the memory cell.

\* \* \* \* \*